United States Patent [19]

Schweitzer, Jr.

[11] Patent Number: 4,686,518
[45] Date of Patent: Aug. 11, 1987

[54] FAULT INDICATOR HAVING TRIP INHIBIT CIRCUIT

[76] Inventor: Edmund O. Schweitzer, Jr., 2433 Center St., Northbrook, Ill. 60062

[21] Appl. No.: 518,535

[22] Filed: Jul. 29, 1983

[51] Int. Cl.⁴ .............................................. G08B 21/00
[52] U.S. Cl. .................................. 340/664; 324/127; 324/133
[58] Field of Search .................... 340/664, 654, 634; 324/133, 127, 122; 361/94

[56] References Cited

U.S. PATENT DOCUMENTS

| 1,871,787 | 8/1932 | Goldsborough | 361/94 X |
| 2,551,022 | 5/1951 | Lerstrup | 361/94 X |
| 3,496,417 | 2/1970 | Tenenbaum | 361/94 |
| 3,733,595 | 5/1973 | Benedict | 340/634 X |
| 4,007,456 | 2/1977 | Paige et al. | 340/634 X |
| 4,063,171 | 12/1977 | Schweitzer, Jr. | 324/133 |
| 4,153,924 | 5/1979 | Moran | 361/94 |
| 4,251,770 | 2/1981 | Schweitzer, Jr. | 324/133 |
| 4,263,550 | 4/1981 | Schweitzer, Jr. | 324/133 |
| 4,345,242 | 8/1982 | Ienna-Balistreri | 340/634 |

Primary Examiner—James L. Rowland
Assistant Examiner—Daniel Myer
Attorney, Agent, or Firm—Lockwood, Alex, FitzGibbon & Cummings

[57] ABSTRACT

A fault indicator includes a status indicator for indicating normal and fault conditions on a monitored conductor. Trip circuitry within the fault indicator conditions the status indicator from a normal-indicating to a fault-indicating state upon the occurrence of a fault current in the conductor. Trip inhibit circuitry, including a loss of voltage sensor, inhibits the trip circuitry following a power failure whereby the fault indicator is rendered insensitive to inrush current during a period immediately following restoration of power to the system.

7 Claims, 20 Drawing Figures

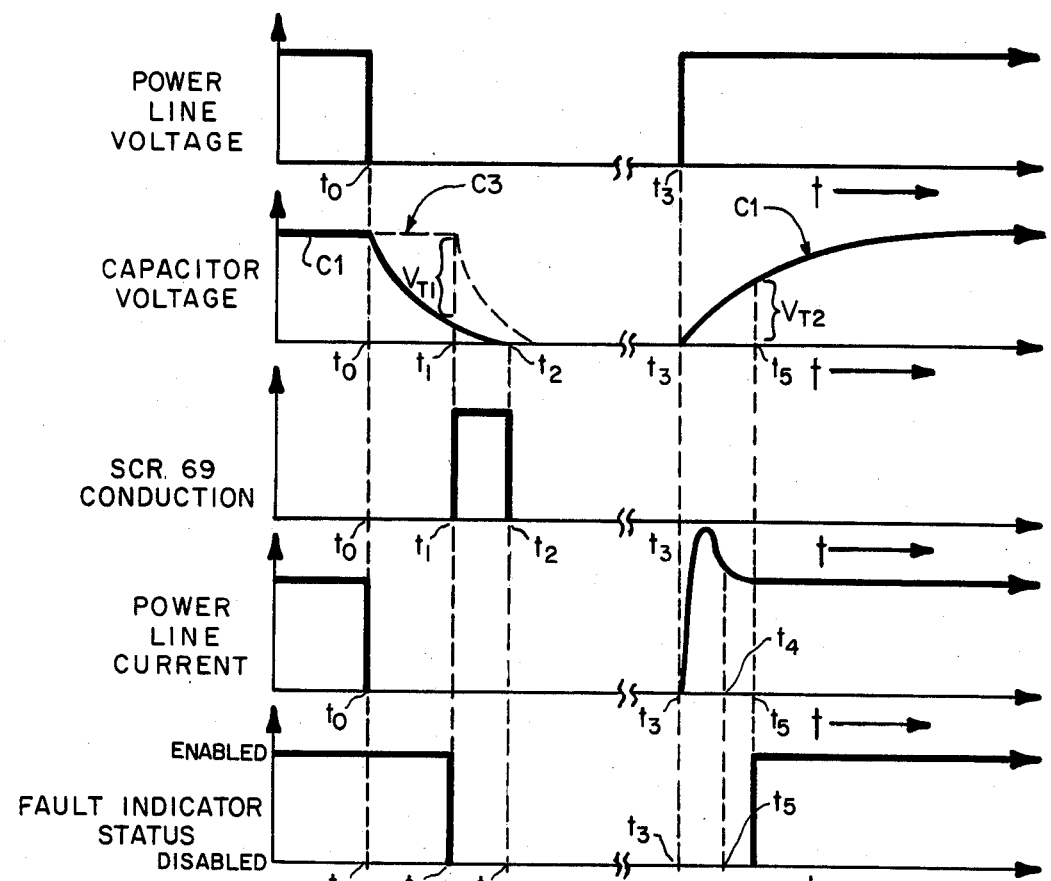
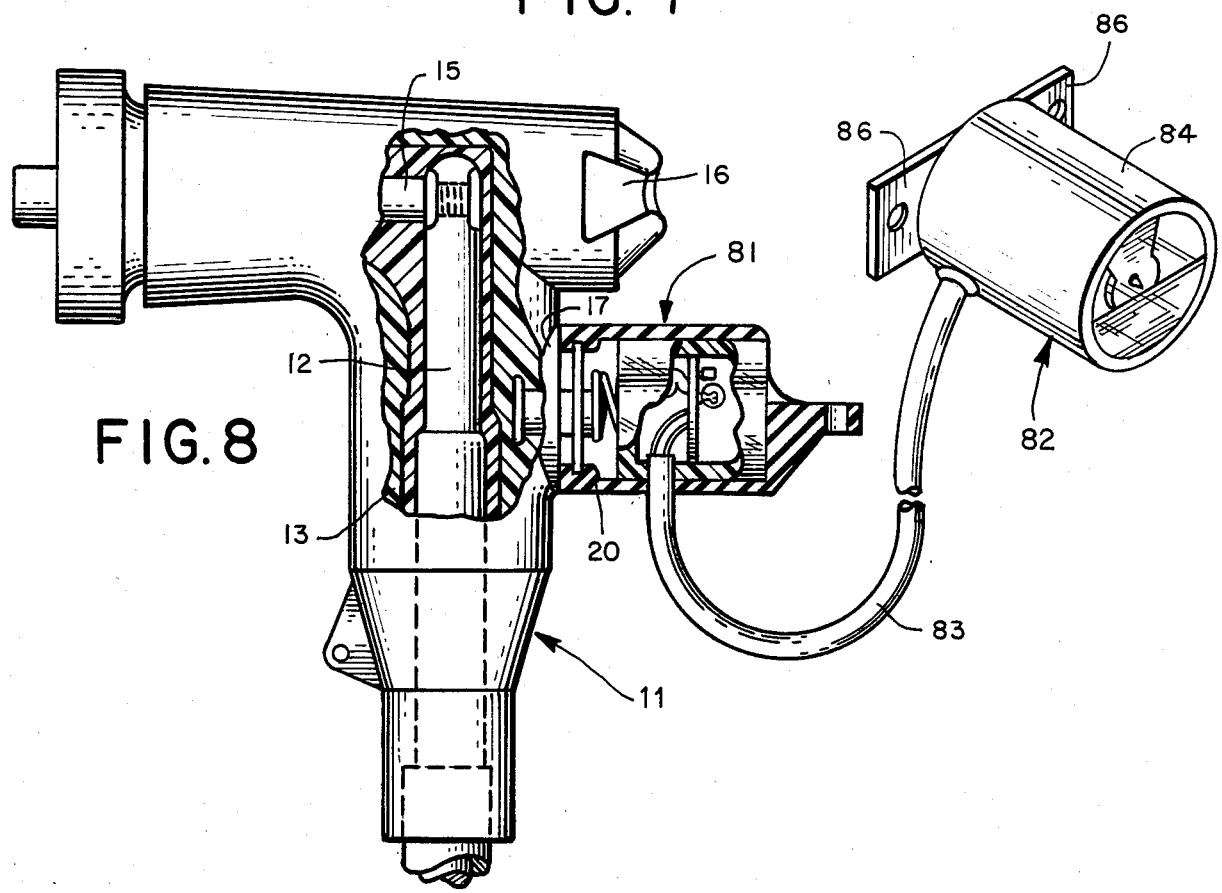
FIG. 7
FIG. 8

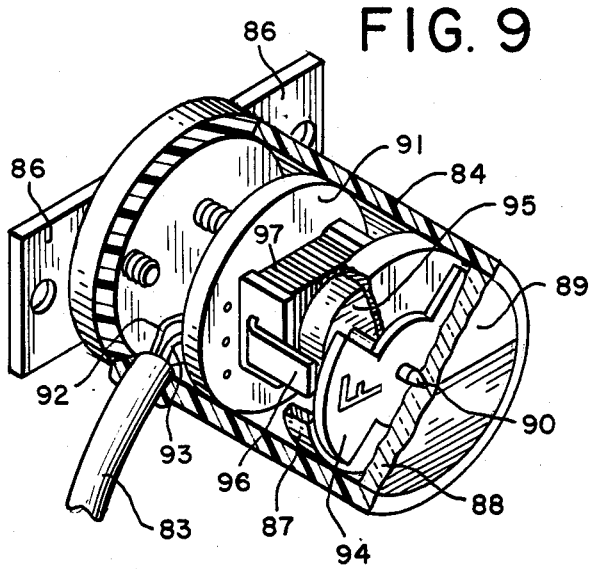
FIG. 9
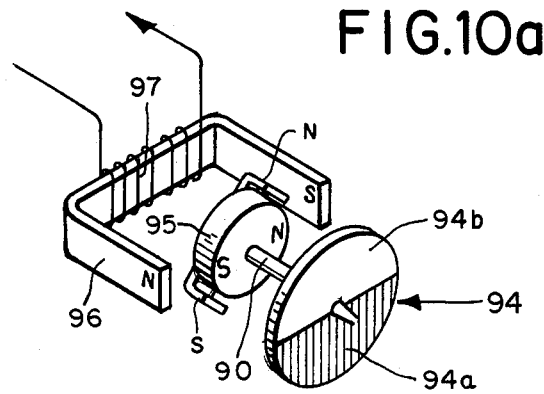
FIG. 10a
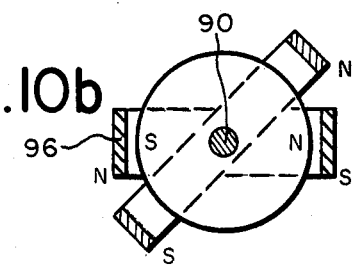
FIG. 10b
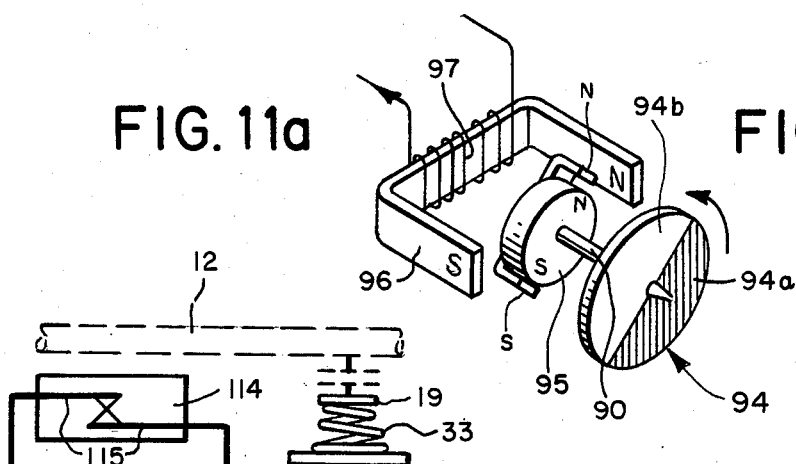
FIG. 11a
FIG. 11b
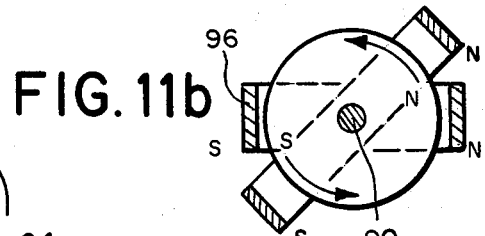
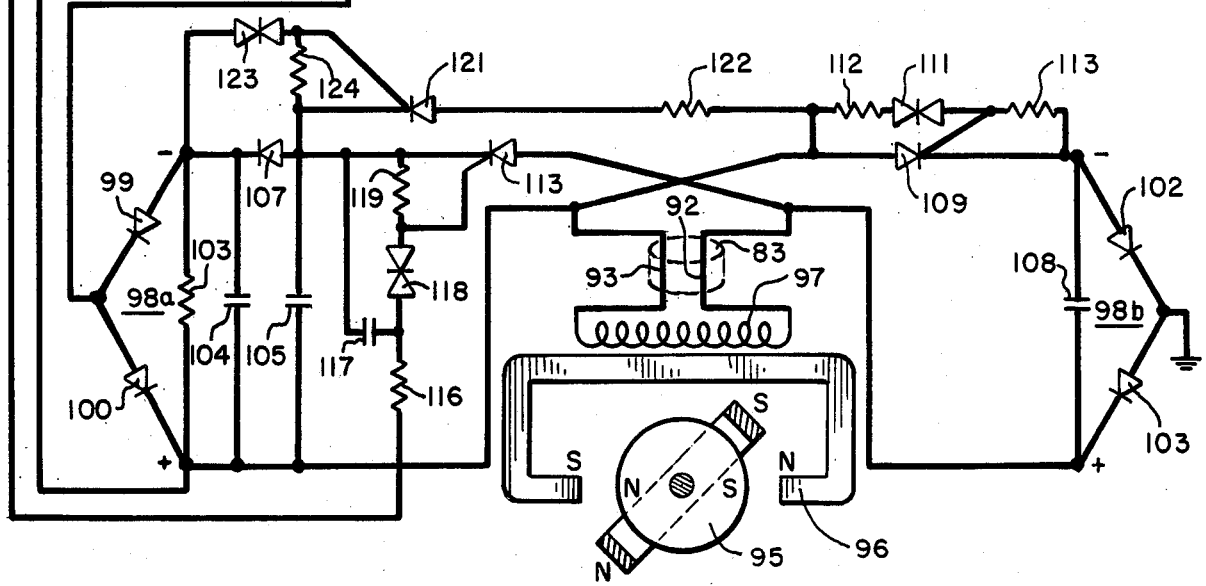
FIG. 12

4,686,518

FAULT INDICATOR HAVING TRIP INHIBIT CIRCUIT

BACKGROUND OF THE INVENTION

The present invention relates generally to fault current indicators for alternating current electrical distribution systems, and more particularly to fault indicators having circuitry for disabling the indicator for a predetermined period of time following initial energization of a monitored circuit.

Fault indicators of various types have been constructed for detecting faults in electrical power distribution systems. Such indicators include clamp-on type fault indicators, which clamp directly over cables in the system, and test point-type indicators, which are mounted over test points in the cables or associated connectors. Fault indicators of both types may be either of the manually reset type, wherein it is necessary that the indicator be physically reset following each fault, or of the automatically reset type, wherein a fault indication is reset upon restoration of line current. Examples of such fault indicators are found in products manufactured by E. O. Schweitzer Manufacturing Company of Mundelein, Ill., and in U.S. Pat. Nos. 4,063,171, 4,251,770 and 4,263,550 of the present inventor.

Since fault conditions in a distribution system may be transitory in nature, as, for example, when a tree branch momentarily contacts a high voltage conductor, distribution circuits are frequently provided with automatic reclosers. In such circuits, the occurrence of a transitory fault will result in the opening of the circuit breakers along the affected portion of the circuit. Any fault indicators installed along the faulted conductor will indicate a fault condition. After a brief interval, the circuit interrupter is automatically reclosed by the recloser. If following reclosure the current is within normal limits, as would be the case if the fault condition was transitory and thus no longer present, the circuit interrupter remains closed and power is distributed through the associated portion of the system. If the fault condition is not transitory, and hence is still present at the time of the automatic recloser cycling, the circuit breaker again trips and power is not supplied to the affected portion of the distribution system. Following a predetermined number of recloser cyclings, the circuit breaker typically will no longer automatically reclose, and power will be removed from the affected section of the distribution system until such time as the fault condition is corrected, and the circuit breaker is manually reset.

Upon each cycling of the automatic recloser, the momentary inrush or initial transient current in the system may exceed normal current limits in the circuit for a short period of time immediately following the recloser cycling. In fact, the inrush current may reach 10 to 20 times the normal steady state current of the conductor and may last for one-half cycle. Frequently, this results in fault indicators installed in circuit branches switched by the circuit interrupter but not affected by the original fault condition being tripped. Consequently, a series of false fault indications may be made in correctly functioning portions of the distribution system.

The present invention is directed toward means for preventing the false tripping of fault indicators by the momentary inrush current immediately following restoration of power, as by the operation of the automatic circuit recloser. To prevent such false tripping, a fault indicator is provided wherein the fault indicator is disabled for a period immediately following re-energization of the circuit monitored by the fault indicator.

Accordingly, it is a general object of the present invention to provide a new and improved fault indicator.

It is a more specific object of the present invention to provide a new and improved fault indicator which remains insensitive to momentary or transient inrush current following restoration of current in a monitored circuit.

SUMMARY OF THE INVENTION

The invention is directed to a fault indicator for indicating the occurrence of a fault current in an electrical conductor of an alternating current distribution power system. The indicator includes status indicating means having reset-indicating and fault-indicating states. Trip means operatively associated with the status indicating means condition the status indicating means to the fault-indicating state in response to the occurrence of a fault current in the electrical conductor. Trip inhibit means operatively associated with the status indicating means and with the trip means inhibit the trip means for a period following energization of the electrical conductor, whereby the fault indicator is not responsive to the occurrence of a fault current in the electrical conductor during a period following energization of the electrical conductor.

BRIEF DESCRIPTION OF THE DRAWINGS

The features of the present invention which are believed to be novel are set forth with particularity in the appended claims. The invention, together with the further advantages thereof, can best be understood by reference to the following description taken in conjunction with the accompanying drawings, in the several figures in which like reference numerals identify like elements, and in which:

FIG. 7 is a depiction of certain time, voltage and current relationships of the fault indicator useful in understanding the operation thereof.

FIG. 8 is a side elevational view, partially in section illustrating a resettable trip-inhibited remote indicating fault indicator constructed in accordance with the present invention mounted on the test-point terminal of a plug-in terminal connector.

FIG. 9 is a fragmentary perspective view of the remote indicating module of the fault indicator illustrated in FIG. 8.

FIGS. 10a and 10b are diagrammatic views of the principal components of the fault indicator illustrated in FIG. 8 in a reset state.

FIGS. 11a and 11b are diagrammatic views similar to FIGS. 10a and 10b, respectively, showing the principal components of the fault indicator in transition between a reset state and a tripped state.

FIG. 12 is an electrical schematic diagram of the indicator illustrated in FIG. 8.

DESCRIPTION OF THE PREFERRED EMBODIMENT

Figure 1:
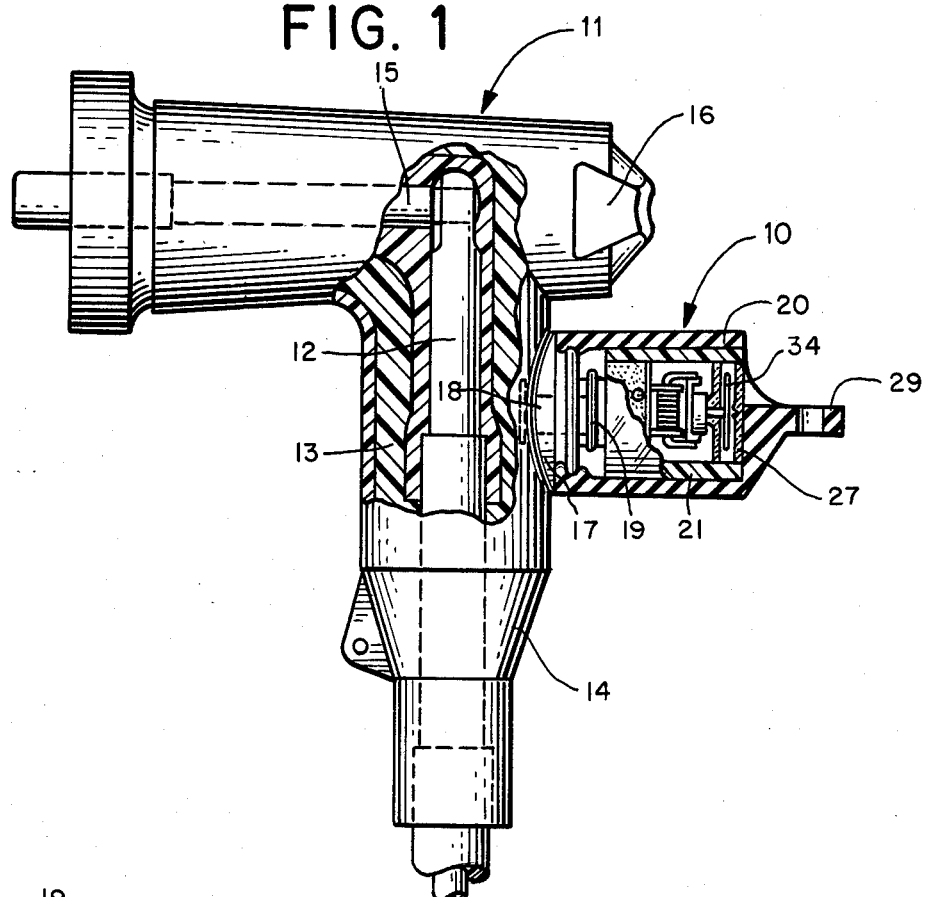
FIG. 1 is a side elevational view, partially in section, illustrating a resettable trip-inhibited fault indicator constructed in accordance with the present invention mounted on the test-point terminal of an elbow-type terminal connector.
Figure 2:
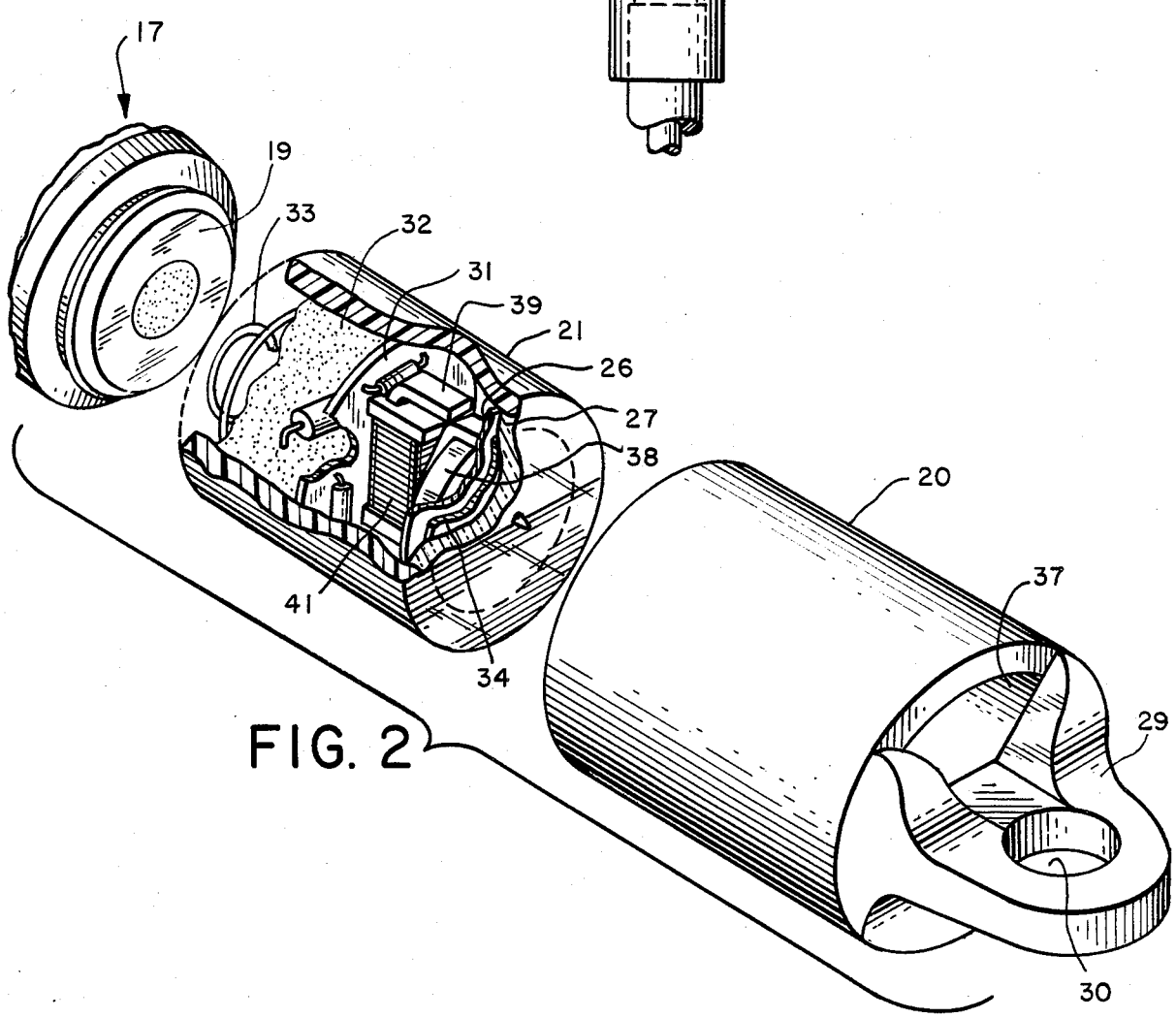
FIG. 2 is a fragmentary perspective view of the fault indicator of FIG. 1 in a partially disassembled state.

Referring to the drawings, and particularly to FIGS. 1 and 2, a trip-inhibited fault indicator 10 constructed in accordance with the invention is shown installed on a plug-in elbow connector 11 of conventional construction for use in high voltage alternating current systems for establishing a plug-in connection to a transformer (not shown) or other device. As shown, the connector 11 includes generally an axial conductor 12 extending through an electrically insulating body portion 13 encased in an electrically-conductive sheath 14, the sheath being grounded in accordance with conventional practice. An electrically-conductive contact member 15, threaded at one end into an aperture in the end of conductor 11, extends from conductor 11 to mate with a complementary contact on the device. An arcuate member 16 having ends anchored in the conductive sheath 14 extends from the connector to receive the hooked end of a lineman's tool commonly used to remove plug-in connectors from such devices.

Elbow connector 11 includes a test point terminal 17 for receiving a circuit condition indicating device, in this case the fault current indicator 10. The test point is formed by a portion of the insulating body portion 13, which projects radially through the conductive sheath 14. Embedded in the test point terminal 17 is an electrically conductive contact 18 having an annular outer flange portion 19 which is exposed at the outer end of the terminal to provide an electrical connection to the contact, and an inner portion in proximity to conductor 12 to capacitively couple fault indicating circuitry in the fault indicator 10 to the conductor.

The housing of the fault indicator 10 comprises an electrically conductive semi-flexible rubber outer shell 20 which is open at one end for mounting to test point terminal 17. The shell 20 is hollow for receiving a correspondingly sized cylindrical transparent plastic housing 21 in which the electrical components of the fault indicator device are contained. An annular flange 25 extending inwardly at the open end of the outer shell 20 secures the shell over a test point. The cylindrical housing 21 includes an integral partition 26 which serves as a mask and spacing element; and an end cap 27 which is sonically welded to the end of the housing. At the closed end of the shell 20, a tab 29 having an aperture 30 therethrough is provided to facilitate the removal of the fault indicator with a conventional hooked lineman's tool.

Referring again to FIGS. 1 and 2, a disc-shaped insulator board 31 is positioned within housing 21 perpendicular to the axis of the housing in a location intermediate the ends thereof. The insulator board, which may be secured in position by an epoxy material 32, serves as mounting means for the electrical components of the fault indicator circuitry. An electrical connection is established between this circuitry and test point contact 19 by means of a helical spring 33, the spring being connected at one end to a wire conductor extending from the circuit board, and being resiliently pressed at the other end against contact 19. An electrical ground connection is established to the circuit board by means of an additional electrical conductor compressively wedged between housing 21 and the electrically conductive grounded outer shell 20.

To provide an indication of the occurrence of a fault current in conductor 11, the fault indicator includes within the lower end of housing 21 a disc-shaped target 34 which is mounted for rotation on a pivot 36. The face of the target disc has a red segment 34a (FIGS. 3-5) and a white segment 34b (FIGS. 3-5) each comprising one half of the target face, only one of which segment is visible at a time through a window 37 provided in housing 20 and the transparent end of housing 21.

Figure 3A:
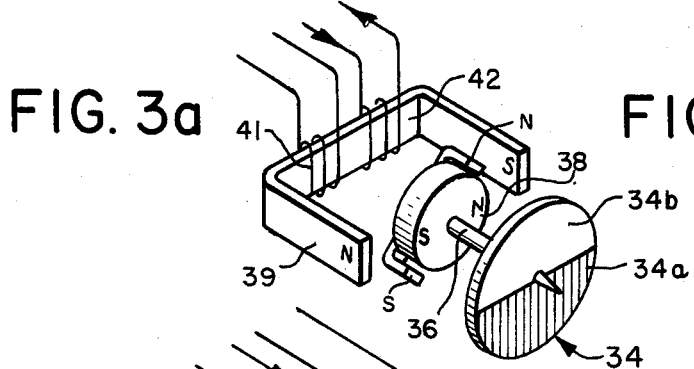
FIGS. 3a and 3b are diagrammatic views of the principal components of the fault indicator in a reset state.
Figure 3B:
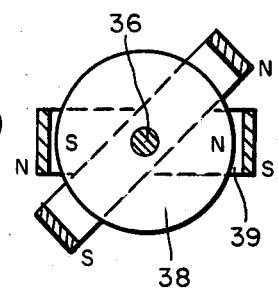
Figure 4A:
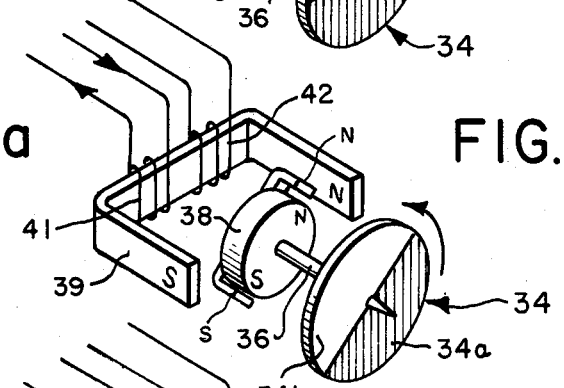
FIGS. 4a and 4b are diagrammatic views similar to FIGS. 3a and 3b, respectively, showing the principal components of the fault indicator in transition between a reset state and a tripped state.
Figure 4B:
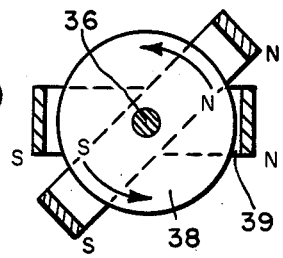

Secured to and pivotal with target 34 is a target permanent magnet 38 which is formed of a magnetic material having a high coercive force, such as ceramic, and is magnetically polarized to form two magnetic poles of opposite gender, as indicated in FIGS. 3-5, with opposite magnetic polarities along a diameter of the magnet. The target disc 34 and its permanent magnet 38 are biased to the position shown in FIGS. 3a and 3b when the fault indicator is in a non-tripped or reset condition by means of a stationary generally U-shaped magnetic pole piece 39, which is located within housing 21 generally coplanar with the axis of rotation of target disc 34.

The pole piece 39, which is preferably formed of a magnetic material having a relatively low coercive force, such as a chrome steel, is biased at its projecting ends to the magnetic polarities indicated in FIGS. 3a and 3b. As shown in FIGS. 3-4 the ends of the pole piece are positioned in close proximity to target magnet 38. As a result, the opposite polarity magnetic poles of the target magnet are attracted to position the target disc 34 as shown. In the position shown in FIG. 3a the red segment 34A of the target disc is not visible through window 37, and all that is seen is the white segment 34B.

Figure 5A:
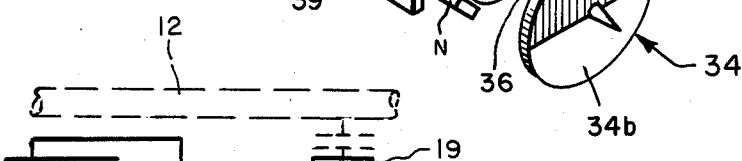
FIGS. 5a and 5b are diagrammatic views similar to FIGS. 3a and 3b, respectively, showing the principal components of the fault indicator in a tripped state.
Figure 5B:
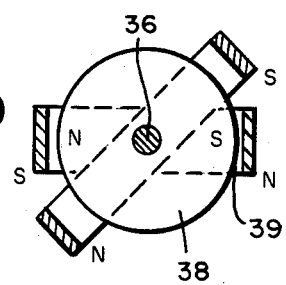

On the occurrence of a fault current in conductor 12, which may, for example, exceed 400 amperes, pole piece 39 is remagnetized to the magnetic polarities shown in FIGS. 4 and 5 by momentary energization of a trip winding 41 on the center section of the pole piece. As a result, the poles of magnet 38 are repelled by the adjacent like-gender poles of the pole piece and the target disc is caused to rotate 180° to the tripped position shown in FIGS. 5a and 5b. In this position, the red segment 34b of the target disc is visible through window 37 (FIG. 2) and a lineman viewing the fault indicator is advised that a fault current has flowed through conductor 11.

The target disc remains in the fault indicating position until the ends of pole piece 39 are subsequently remagnetized to the magnetic polarities shown in FIGS. 3a and 3b by momentary energization of a reset winding 42 on the center section of the pole piece. As a result, the target magnet 38, and hence the target disc 34, are caused to rotate from the tripped position shown in FIGS. 5a and 5b to the reset position shown in FIGS. 3a and 3b, and the fault indicator is conditioned to respond to a subsequent fault current.

Energization of trip winding 41 upon occurrence of a fault current in conductor 12, and energization of reset winding 42 upon restoration of current in the conductor 12 following a fault, is accomplished by means of externally-powered circuitry contained within the fault indicator. Referring to the schematic diagram shown in FIG. 6, windings 41 and 42 are connected end-to-end for independent energization upon occurrence of fault and reset conditions, respectively. Operating power for these windings is obtained by means of a bridge rectifier network 43, consisting of diodes 46–49. One input terminal of this network, formed at the juncture of the anode of diode 46 and the cathode of diode 47, is connected through the helical spring 33 to test point contact 19. The other input terminal, formed at the anode of diode 48 and the cathode of diode 49, is connected to ground through the electrically conductive outer shell 20 of the fault indicator housing. With this arrangement, high voltage alternating current carried in conductor 12 is capacitively coupled to the bridge rectifier network, resulting in the production of a pulsating unidirectional current at the output terminals of the network.

The positive polarity output terminal of the bridge rectifier network, formed at the cathodes of diodes 46 and 48, is connected to one contact 51 of a reed switch 52, to the commonly-connected end terminals of windings 41 and 42, and to respective terminals of first, second and third capacitors 53, 54 and 55, respectively. The negative polarity output terminal of the bridge rectifier network, formed at the juncture of the anodes of diodes 47 and 49, is connected directed to the remaining terminal of capacitor 53. The negative polarity output terminal is also connected through a forward-biased diode 57 to the remaining terminal of capacitor 54, and through still another forward-biased diode 58, to the remaining terminal of capacitor 55. With this arrangement, capacitors 53, 54 and 55 are charged by the pulsating unidirectional current developed by bridge rectifier network 43 during normal current flow in conductor 12.

To provide for periodic energization of reset winding 42 during normal current flow in conductor 12, the remaining end terminal of winding 42 is connected through a silicon controlled rectifier (SCR) 59 to the negative polarity terminal of capacitor 54. Periodic conduction through SCR 59 is obtained by connecting the gate electrode of that device to the positive polarity output terminal of bridge rectifier network 43 through a resistor 61 and a bilateral diode 62, and to the cathode of SCR 59 through a resistor 63. With this arrangement, SCR 59 is periodically triggered into conduction when the voltage developed across bilateral diode 62 as a result of reset energization capacitor 54 being charged by bridge rectifier 43 reaches the threshold level of the bilateral diode.

In operation, under normal current flow conditions, the voltage developed across capacitor 54 as the capacitor is charged by bridge rectifier network 43 progressively increases with time, until the threshold breakdown voltage of bilateral diode 62 is reached, at which time SCR 59 is triggered and capacitor 54 discharges through winding 42. Diode 58 prevents trip energization capacitor 55 from being discharged through SCR 59 and winding 42, leaving the capacitor available for energizing trip winding 41 in response to a fault condition. In practice, the breakdown voltage of bilateral diode 62 may be in the order of 34 volts, and the time required for capacitor 54 to reach this threshold level with a typical voltage level of 4,400 volts on conductor 12 may be approximately 2 minutes. In any case, the voltage level within conductor 12 is not critical to the operation of the reset circuit, and has only the effect of changing the repetition rate of the reset cycle.

Trip winding 41 is energized upon occurrence of a fault current in conductor 12 by discharge of capacitor 55 through a second silicon controlled rectifier 64. Conduction is established through SCR 64 by closure of the contacts 51 of reed switch 52, which is positioned within housing 21 in close proximity to conductor 12 such that the alternating magnetic field produced in the vicinity of conductor 12 upon generation of a fault current is sufficient to close the contacts of the reed switch. The gate electrode of SCR 64 is connected through a bilateral diode 66 and a resistor 67 to the remaining contact of reed switch 52, and through a resistor 65 to the SCR cathode. The juncture of resistor 67 and bilateral diode 66 is connected by a capacitor 68 to capacitor 55.

Upon occurrence of a fault current in conductor 12, the positive polarity output terminal of bridge rectifier network 43 is connected through the closed contacts of reed switch 52 and the circuit comprising resistor 67, bilateral diode 66, resistor 65 and capacitor 68 to the gate electrode of SCR 64, causing that device to be rendered conductive following a predetermined time delay to preclude, in known manner, simultaneous conduction through SCR 59 and SCR 64. At this time capacitors 54 and 55 are caused to discharge through SCR 64 and energize winding 41. The resulting magnetic flux in the U-shaped pole piece 39 reverses the magnetic pole polarities of the pole piece and causes rotation of the target as previously described.

In accordance with the invention, to preclude the possibility of false fault-current indications caused by momentary excessive current surges upon restoration of current, as upon automatic recloser cycling, a trip inhibit feature is provided to disable the fault indicator for a predetermined period following re-energization of the conductor 12 after a loss of voltage thereon. To this end, discharge means for trip energization capacitor 55 are provided in the form of a third SCR 69 and a series connected resistor 71. The cathode of SCR 69 is connected to the negative polarity terminal of capacitor 55, while the anode of SCR 69 is connected through resistor 71 to the positive polarity terminal of the capacitor. When SCR 69 is triggered to its ON or conductive state, capacitor 55 discharges through the SCR and resistor 71. When capacitor 55 is discharged in this manner, trip winding 41 is not included in the capacitor discharge path. Consequently, the indicator target 34 will remain in the reset or normal position shown in FIGS. 3a and 3b while capacitor 55 discharges. The discharge of capacitor 55 renders the fault indicator insensitive to the closure of reed switch contacts 51 since the voltage across the discharged capacitor is now insufficient to exceed the bilateral diode 66 threshold voltage. Thus, closure of the reed switch contacts during the period in which the capacitor 55 voltage is less than the bilateral diode 66 threshold voltage will not result in energization of trip winding 41.

In order to trigger SCR 69 and thereby temporarily inhibit the fault indicating circuitry, means are provided for detecting the loss of voltage in the conductor 12 being monitored. This means include capacitor 53, connected between the positive and negative polarity outputs of bridge rectifier 43, and the reset circuit capacitor 55. Discharge means in the form of a parallel connected resistor 72, provides a discharge path for capacitor 53. The gate of SCR 69 is connected througha bilateral diode 73 to the negative polarity output terminal of the bridge rectifier, and through a resistor 74 to both the negative polarity terminal of the trip winding energization capacitor 55, and the cathode of SCR 69.

Upon the loss of voltage on conductor 12, the output of bridge rectifier 43 drops to zero. Since unidirectional charge current pulses are now no longer being produced at the bridge rectifier output, capacitor 53 discharges through parallel-connected resistor 72 with a time constant determined primarily by the respective values of those two components. Diodes 57 and 58, having now become reversed biased, prevent the concurrent discharge of capacitors 54 and 55 through resistor 72. Consequently, a voltage difference develops between the negative polarity terminals of capacitors 53 and 55. When the voltage difference between the two capacitors exceeds the threshold voltage of bilateral diode 73, the bilateral diode becomes conductive thereby allowing capacitor 55 to partially discharge through diode 73 and resistor 74. The resulting positive polarity voltage appearing at the junction of the bilateral diode and resistor 74 is applied to the gate of SCR 69, thereby rendering the SCR conductive and allowing trip energization capacitor 55 to discharge through SCR 69 and resistor 71.

Once the trip winding energization capacitor 55 has been discharged, the fault indicator is incapable of being triggered to the fault indicating state until such time as capacitor 55 is charged to a voltage exceeding the threshold voltage of bilateral diode 66.

In a typical embodiment, capacitor 53 may have a value of 0.05 microfarads, capacitors 54 and 55 may each have a value of 2 microfarads and the threshold voltage of bilateral diodes 62, 66 and 73 may each be on the order of 32-36 volts. With components of these values, and with a typical voltage level of 4,000 volts on conductor 12, the time necessary to charge capacitor 55 to the bilateral diode threshold voltage may be approximately two to four minutes. Thus, it is seen that the fault indicator shown schematically in FIG. 6 will remain insensitive to the occurrence of fault currents in conductor 11 for a definite period following re-energization of the conductor.

Figure 6:
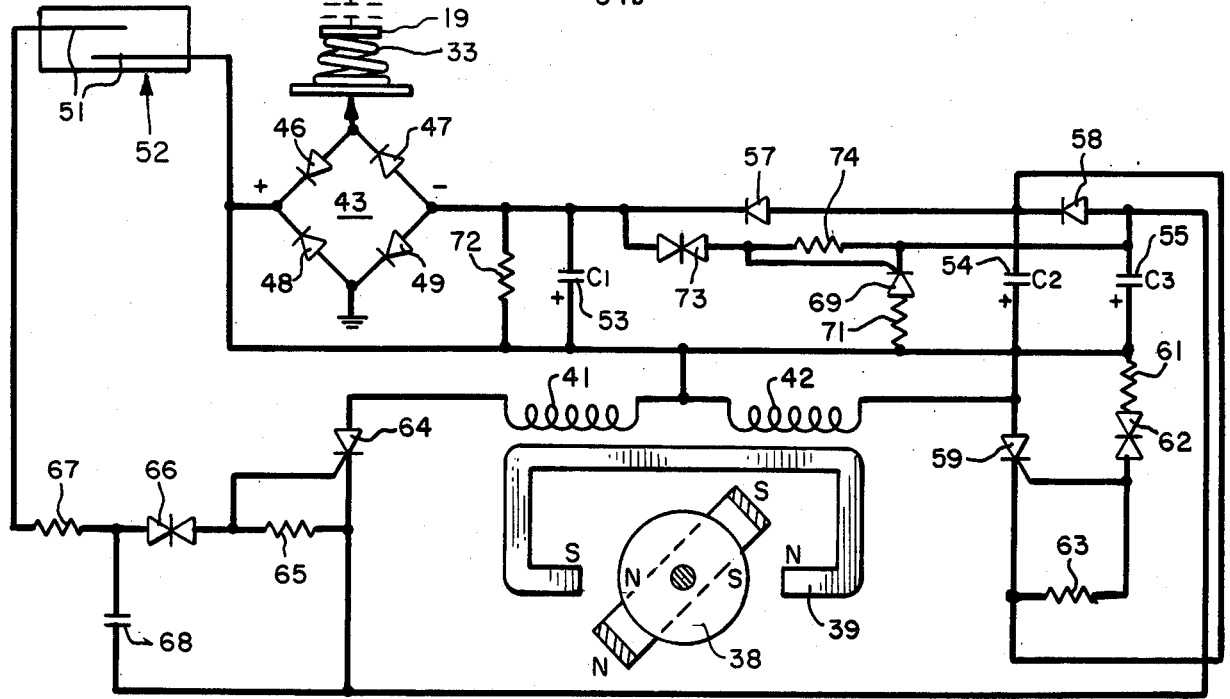
FIG. 6 is an electrical schematic diagram of the fault indicator illustrated in FIG. 1.

The operation of the trip inhibit circuitry may be better understood by reference to FIG. 7, which depicts various voltage and current waveforms with respect to time, existing in an operating circuit of the type shown schematically in FIG. 6. FIG. 7 depicts the power line voltage on the conductor of a distribution system. In the figure, the voltage drops to zero following a power failure at time $t_0$, and is eventually restored at time $t_3$. The voltages across capacitors 53 and 55 are illustrated by the solid and broken lines labeled $C_1$ and $C_3$, respectively. It is seen that the voltage of capacitor 53 decreases exponentially upon the occurrence of the power failure at time $t_0$. The voltage of capacitor 55 remains substantially unchanged during the time capacitor 53 discharges until time $t_1$, when the difference in capacitor voltages exceeds the threshold voltage of bilateral diode 73, designated $V_{T1}$ in the figure. When the threshold voltage $V_{T1}$ is reached, SCR 69 becomes conductive as shown and remains conductive until $t_2$, at which time the trip energization capacitor 55 forward discharge current becomes insufficient to maintain forward conduction of SCR 69. FIG. 7 includes a graphical representation of the disabling function of the trip inhibiting circuitry and illustrates the fault indicator becoming disabled at time $t_1$ when SCR 69 becomes conductive to discharge capacitor 55.

In FIG. 7 power is restored to the distribution system at time $t_3$. The figure graphically represents the power line current at both $t_0$, the time of power failure, and time $t_3$, the time at which power is restored to the system. During steady state conditions, such as those existing prior to time $t_0$ and subsequent to time $t_4$, the power line current is less than the fault current level for the particular conductor. During the period immediately following $t_3$, re-energization at the power line current may momentarily exceed the fault current level, as indicated. (Typically, the inrush current exceeds the normal current level for a period of one-half cycle, illustrated as time interval $t_3-t_4$). Fault indicators on the line, which remain enabled during the time interval $t_3-t_4$, may be triggered to a fault indicating state by the power line inrush current even through such indicators were unaffected by the fault current originally causing the circuit breaker to open at time $t_0$. Consequently, a number of false fault indications may exist by reason of the power line surge current existing immediately following the cycling of a circuit recloser at time $t_3$. The trip inhibit circuitry included in the fault indicator described herein renders the fault indicator insensitive to fault currents occurring during the interval $t_3-t_4$ during which time such power line initial surge currents can occur.

When power is restored to the system at time $t_3$, capacitors 53 and 55 will each begin to charge exponentially as shown, by reason of the unidirectional charge current pulses appearing at the output of bridge rectifier 43. The charge rate for these capacitors is determined primarily by the component values of the individual capacitors and the resistance of the charge circuit. In a typical embodiment, two to four minutes may be required to fully charge these capacitors. The fault indicator will remain disabled until at least time $t_5$, the time at which the voltage of capacitor 55 reaches at least $V_T$, the threshold voltage of bilateral diode 66. Component values are selected so that $t_5$, the time at which the fault indicator becomes enabled, occurs sufficiently after time $t_3$, the time at which the system is re-energized, so that the power line current settles to its steady state level before the fault indicator becomes enabled. Generally, the fault indicator should be disabled for a period of one cycle or more following re-energization in order to avoid false fault indications.

Alternate embodiments of the trip inhibited fault indicator of the invention are illustrated in FIGS. 8–15. In these figures, the fault indicator is adapted and arranged so that the actual signal, indicating a fault condition is made at a location remote from the test point terminal where actual fault sensing occurs. Such remote indicating fault indicators are useful in buried cable distribution systems or other such systems wherein the test point terminals are relatively inaccessible.

Referring to FIGS. 8 and 9, the remote indicating fault indicator includes a circuit module 81 and an indicator module 82 interconnected by means of two conductor cables 83. The circuit module 81 is housed within a test point cap of known construction which can be mounted on the test point terminal 17 of a conventional elbow connector 11 in known fashion.

Referring to FIG. 9, indicator module 82 may include a cylindrical transparent plastic housing 84 within which the components of the module are contained. The module may be mounted by means of a flange 86 having apertures through which appropriate mounting hardware can be installed. Within the housing an integral partition 87 serves as a mask and spacing element, and a transparent end cap 88 sonically welded to the end of the housing seals the interior against contamination while providing a viewing window 89.

A disc-shaped circuit board 91 is positioned perpendicularly to the axis of the housing. This circuit board, which may be secured in position by an epoxy material filling the rear portion of the housing, serves as mounting means for the components of the fault indicator module. An electrical connection is established between the indicator module 82 and the circuit module 81 by cable 83, which includes two electrical conductors 92 and 93 (FIG. 12).

To provide an indication of the occurrence of a fault current, the indicator module includes within the lower end of housing 84 a disc-shaped target indicator 94 mounted for rotation about a pivot point 90. As seen in FIGS. 10 and 11, the face of target indicator 34 has a red segment 94a and a white segment 94b, only one of which is visible at a time through window 89 in the transparent end of housing 84.

Secured to and pivotal with target disc 94 is a target permanent magnet 95, which is formed of a magnetic material having a high coercive force, such as ceramic, and is magnetically polarized to form two magnetic poles of opposite polarity, as indicated in FIGS. 10 and 11, with opposite magnetic polarities along a diameter of the magnet. The target disc 94 and its permanent magnet 95 are biased to the position shown in FIGS. 10a and 10b when the fault indicator is in a non-tripped or reset condition by means of a stationary generally U-shaped magnetic pole piece 96.

Pole piece 96, which is preferably formed of a magnetic material having a relatively low coercive force, such as a chrome steel, in the reset mode is biased at its projecting ends to the magnetic polarities indicated in FIGS. 10a and 10b. As shown in FIG. 9, the ends of the pole piece extend along the side wall of housing 84, in close priximity to target 94. As a result, the opposite polarity magnetic poles of the target magnet 95 are attracted to position the target disc 94 as shown. In this position the red segment 94a of the target disc is not visible through window 89 and all that is seen is the white segment 94b.

On the occurrence of a fault current in conductor 12, pole piece 96 is remagnetized to the magnetic polarities shown in FIGS. 11a and 11b by momentary energization in one direction of a single tapless winding 91 on the center section of the pole piece. As a result, the poles of magnet 96 are repelled by the adjacent like-polarity poles of the pole piece and target disc 94 is caused to rotate 180° to the tripped position. In this position, the red segment 94a of the target disc is visible through window 89, and a lineman viewing the fault indicator is advised that a fault current has passed through conductor 12. The circuit module 81 may contain either of the circuits shown schematically in FIGS. 7 and 8. Both circuits are adapted to be used with indicator means which include a single tapless winding on the pole piece 96.

Referring to FIG. 12, the single untapped winding 97 of indicator module 82 is connected to the circuit module by conductors 92 and 93 of cable 83. Operating power for this winding is obtained by means of two half-wave rectifier networks 98a and 98b, consisting of diodes 99–100, and 102–103, respectively. The input terminal of network 97, formed at the juncture of the anode of diode 100 and the cathode of diode 99, is connected through helical spring 33 to test point contact 19. The input terminal of rectifier 98, formed at the anode of diode 103 and the cathode of diode 102, is connected to ground through the electrically conductive sheath 13 of the circuit module housing. With this arrangement, high voltage alternating current carried in conductor 12 is capacitively coupled to the half wave rectifier networks, resulting in the production of a pulsating unidirectional current at the output terminals of each network.

The positive polarity output terminal of rectifier network 98a, formed at the cathode of diode 100, is connected to one terminal of winding 97 through conductor 93, and to one terminal each of a first capacitor 104, and a second capacitor 105. The negative polarity output terminal of rectifier network 98a, formed at the anode of diode 99, is connected to the remaining terminal of first capacitor 104, and through a forward-biased diode 107 to the remaining terminal of second capacitor 105.

With this arrangement, capacitor 104 is charged directly and capacitor 105 is charged through diode 107 by the pulsating unidirectional current development by rectifier network 98a during normal current flow in conductor 12. The use of two separate half wave rectifiers 98a and 98b instead of a single full wave bridge rectifier reduces internal leakage by eliminating shunt and thus allows faster charging of capacitors 98, 104 and 105.

The positive polarity output terminal of rectifier network 98b, formed at the cathode of diode 103, is connected to the remaining terminal of winding 97 through conductor 92, and to one terminal of a third capacitor 108. The negative polarity output terminal of rectifier network 98, formed at the anode of diode 102, is connected to the remaining terminal of capacitor 108. During periods of normal current flow in conductor 12, capacitor 108 is charged by the unidirectional current pulses appearing at the output terminals of rectifier network 98b.

In order to provide for periodic reset energization of the tapless winding 97 during normal current flow in conductor 12, an end terminal of winding 97 is connected through conductor 93 to the anode of a silicon controlled rectifier (SCR) 109, the cathode of which is connected to the positive polarity terminal of capacitor 108. Periodic conduction through SCR 109 is obtained by connecting the gate electrode of that device to the positive polarity output terminal of rectifier network 98a, through bilateral diode 111 and resistor 112. The SCR 109 gate electrode is also connected to the negative polarity output terminal of rectifier network 98b through resistor 113. When the voltage developed across bilateral diode 111 as a result of capacitor 108 being charged by rectifier network 98b reaches the threshold level of the diode, SCR 109 is triggered into conduction, thereby allowing reset energization capacitor 108 to discharge through winding 97 to reset the device. After capacitor 108 is discharged, SCR 109 becomes non-conductive, thereby allowing capacitor 108 to recharge and hence begin a new periodic reset cycle.

Winding 97 is energized in a second and opposite direction upon occurrence of a fault current in conductor 12 by discharge of second capacitor 105 through a second SCR 113 having its cathode connected to the negative polarity terminal of the capacitor, and its anode connected to the first end terminal of winding 96. Conduction is established through SCR 113 by closure of the contacts of reed switch 114 which is connected between the positive polarity terminal of trip energization capacitor 105 and the gate electrode of SCR 113 by a network comprising a resistor 116 and a capacitor 117, a bilateral diode 118, and a resistor 119. Reed switch 114 is positioned within housing 20 in sufficiently close proximity to conductor 11 such that the contacts of the switch close upon occurrence of a fault current in the conductor.

Upon occurrence of a fault, the positive polarity terminal of trip energization capacitor 105 is connected through the closed contacts of reed switch 114 and the circuit comprising resistors 116 and 119, bilateral diode 118, and capacitor 117 to the gate electrode of SCR 113, causing that device to be rendered conductive. This causes capacitor 105 to discharge through SCR 113, energizing winding 97 in the reverse direction. The resulting magnetic flux in pole piece 39 reverses, causing the target 34 to assume the position indicative of a fault state.

In order to temporarily disable the fault indicator during recloser cycling, and thereby preclude false indications, the fault indicator includes, in accordance with the invention, means for discharging the trip energization capacitor 105 upon loss of voltage of the conductor which takes the form of an SCR 121, the cathode of which is connected to the negative polarity terminal of capacitor 105 and the anode of which is connected through resistor 122 and conductor 93 to winding 97. When SCR 121 is rendered conductive through application of a positive going voltage to its gate electrode, capacitor 105 discharges through SCR 121 and resistor 122 with a discharge time constant determined primarily by the values of capacitor 105 and resistor 122. When capacitor 105 discharges in this manner, winding 97 is not included in the discharge path and consequently the magnetic polarity of pole piece 39 remains unchanged. With capacitor 105 discharged, the fault indicator circuit is rendered insensitive to the closure of reed switch 114 and will remain disabled until such time as capacitor 105 is recharged to at least the threshold voltage of bilateral diode 118.

In a typical embodiment, several seconds or minutes may be required to recharge capacitor 105 to the bilateral diode 118 trigger voltage following re-energization of conductor 11. Thus, the fault indicator will remain disabled for such period of time following re-energization of the conductor.

In order to inhibit the trip function, silicon controlled rectifier 121 is triggered to the conductive state in the following manner. Upon the loss of voltage in conductor 11, capacitor 104 discharges through resistor 123 with a discharge time constant determined primarily by the respective values of the two components. Diode 107, having now become reverse biased, prevents the discharge of trip energization capacitor 105. This capacitor remains substantially fully charged during the period capacitor 104 discharges through resistor 123. The voltage difference between capacitors 104 and 105 appears across the branch comprising bilateral diode 123 and resistor 124. When this voltage difference exceeds the threshold voltage of bilateral diode 123, the diode is rendered conductive, thereby allowing capacitor 105 to partially discharge through the diode and resistor 124. The current through resistor 124 produces a positive polarity signal at the gate of SCR 121 to render the SCR conductive. Once SCR 121 becomes conductive, it remains so until trip energization capacitor 105 is substantially fully discharged therethrough.

Figure 13:
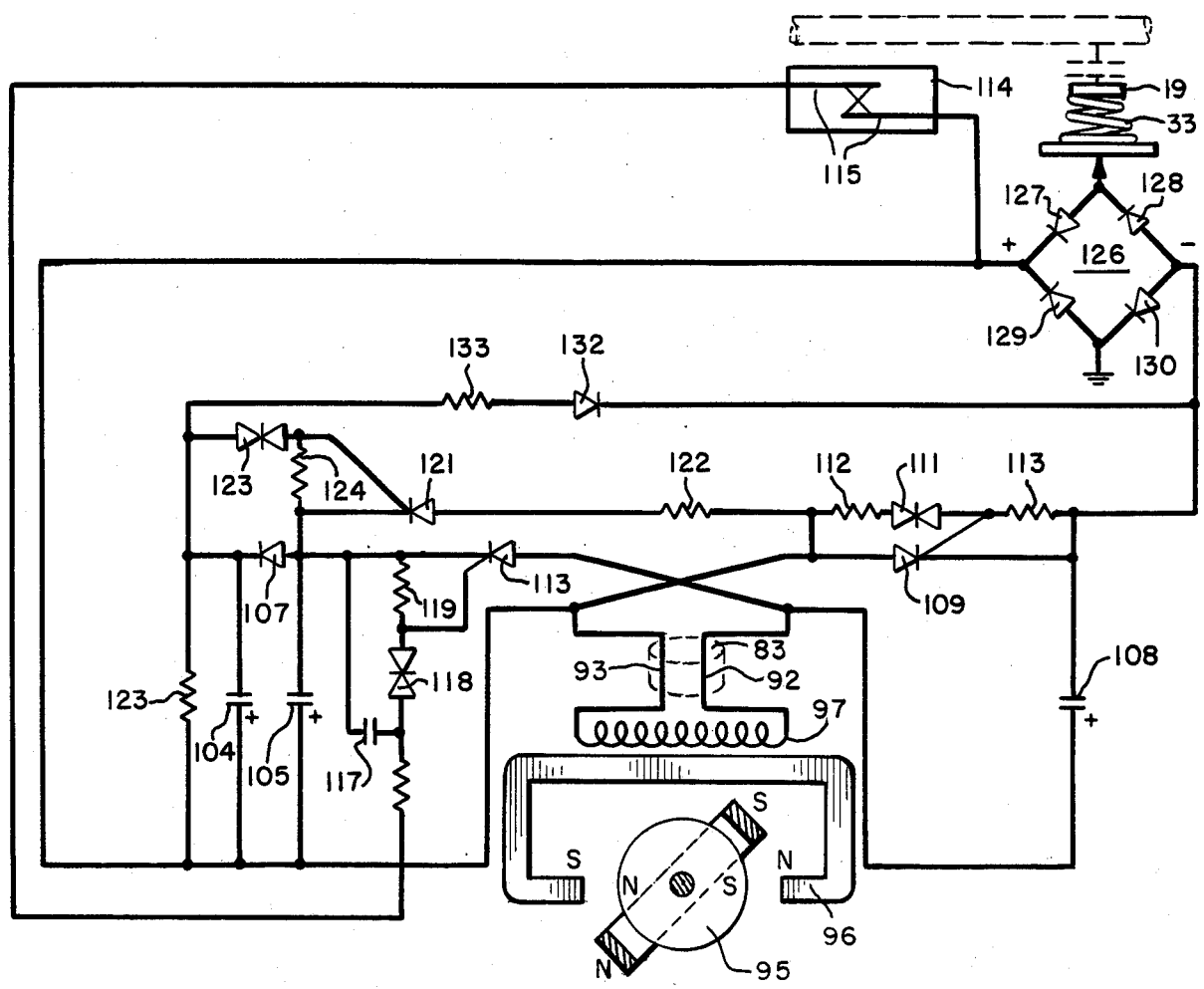
FIG. 13 is an alternate electrical schematic diagram of a fault indicator of the type shown in FIG. 8.

As another alternative, the fault indicator may include within circuit module 81, the circuitry shown schematically in FIG. 13. This circuit is basically similar to the circuit of FIG. 12 and differs only in that it is adapted to be energized by a single conventional bridge rectifier network 126, comprising diodes 127–130. To this end, electrical contact 19, capacitively coupled to conductor 12, is connected through helical spring 33 to an input terminal of bridge rectifier network 126 formed at the junction of the anode of diode 127 and the cathode of diode 128. The other input terminal, formed at the juncture of the anode of diode 129 and the cathode of diode 130, is connected to ground. The positive polarity output terminal formed at the cathodes of diodes 127 and 129 is connected to the positive polarity terminals of capacitors 104 and 105, respectively. The negative output terminal of the bridge rectifier formed at the juncture of the anodes of diodes 128 and 130 is connected to the negative polarity terminal of reset energization capacitor 108 and the cathode of SCR 109. In order to allow the unidirectional pulsating charge current appearing at the bridge rectifier output terminals to charge first and second capacitors 104 and 105, the negative polarity bridge rectifier output terminal is connected to the cathode of diode 132, the anode of which is connected through resistor 133 to the negative polarity terminal of first capacitor 104.

Aside from the configuration of the capacitor charge circuitry, operation of the circuit shown schematically in FIG. 13 is identical with that shown in FIG. 12. The single winding 97 is periodically energized by discharge of reset energization capacitor 108 through automatic reset circuitry comprising SCR 109, bilateral diode 111, resistor 112 and resistor 113. Fault currents in conductor 12, cause the closure of reed switch contacts 115 which in turn causes resistors 116 and 119, capacitor 117 and bilateral diode 118 to trigger SCR 113 thereby allowing trip energization capacitor 105 to discharge through winding 97 and condition the indicator means to the fault indicating position.

To render the fault indicator insensitive to momentary excessive inrush currents, the fault indicator includes trip inhibit circuitry of the type previously described. When the difference in voltage between first and second capacitors 104 and 105 exceeds the threshold voltage of bilateral diode 123, as would occur when capacitor 104 discharges through 123 by reason of a loss of voltage of conductor 11, SCR 121 is triggered to allow trip energization capacitor 105 to discharge through the SCR and resistor 122. The fault indicator circuit will remain disabled until capacitor 105 is charged to at least the threshold voltage of bilateral diode 118, a period which is longer than the period during which excessive inrush current is present.

Figure 14:
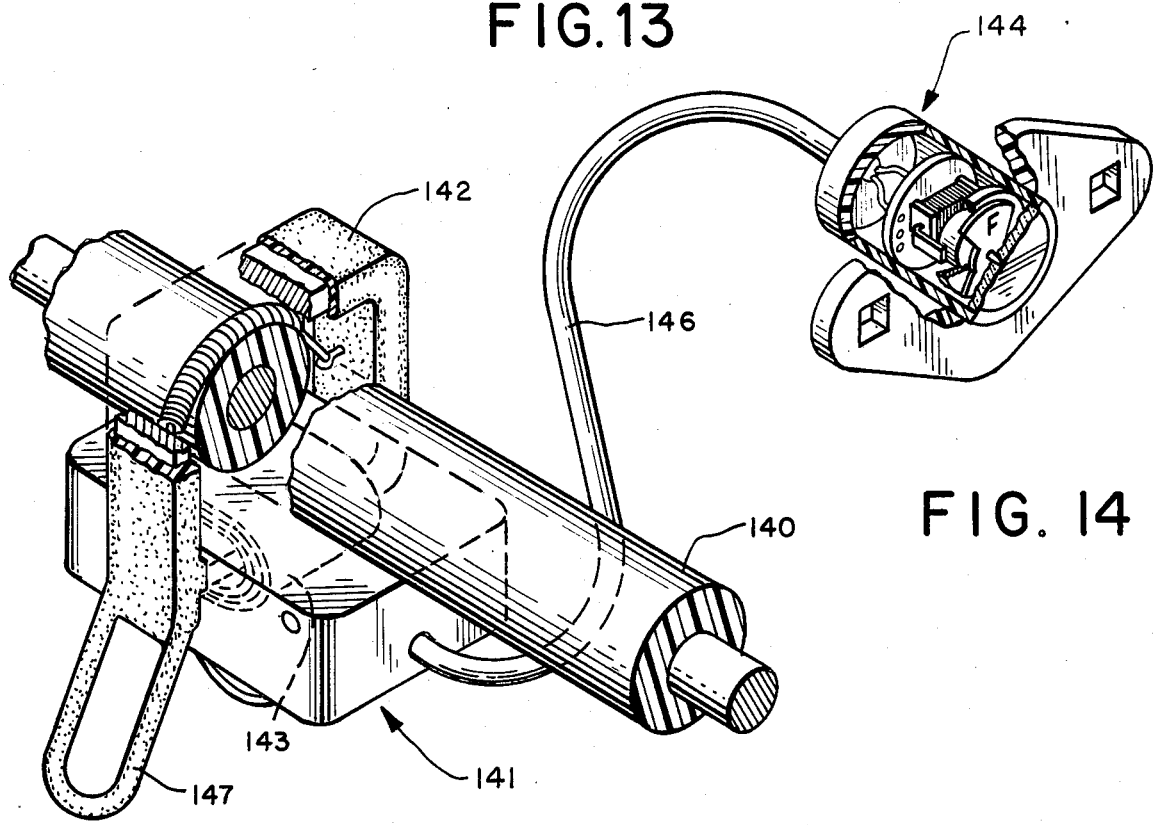
FIG. 14 is a fragmentary perspective view illustrating a resettable current-reset remote-indicating fault indicator constructed in accordance with the present invention mounted on a conductor of a power distribution power system.
Figure 15:
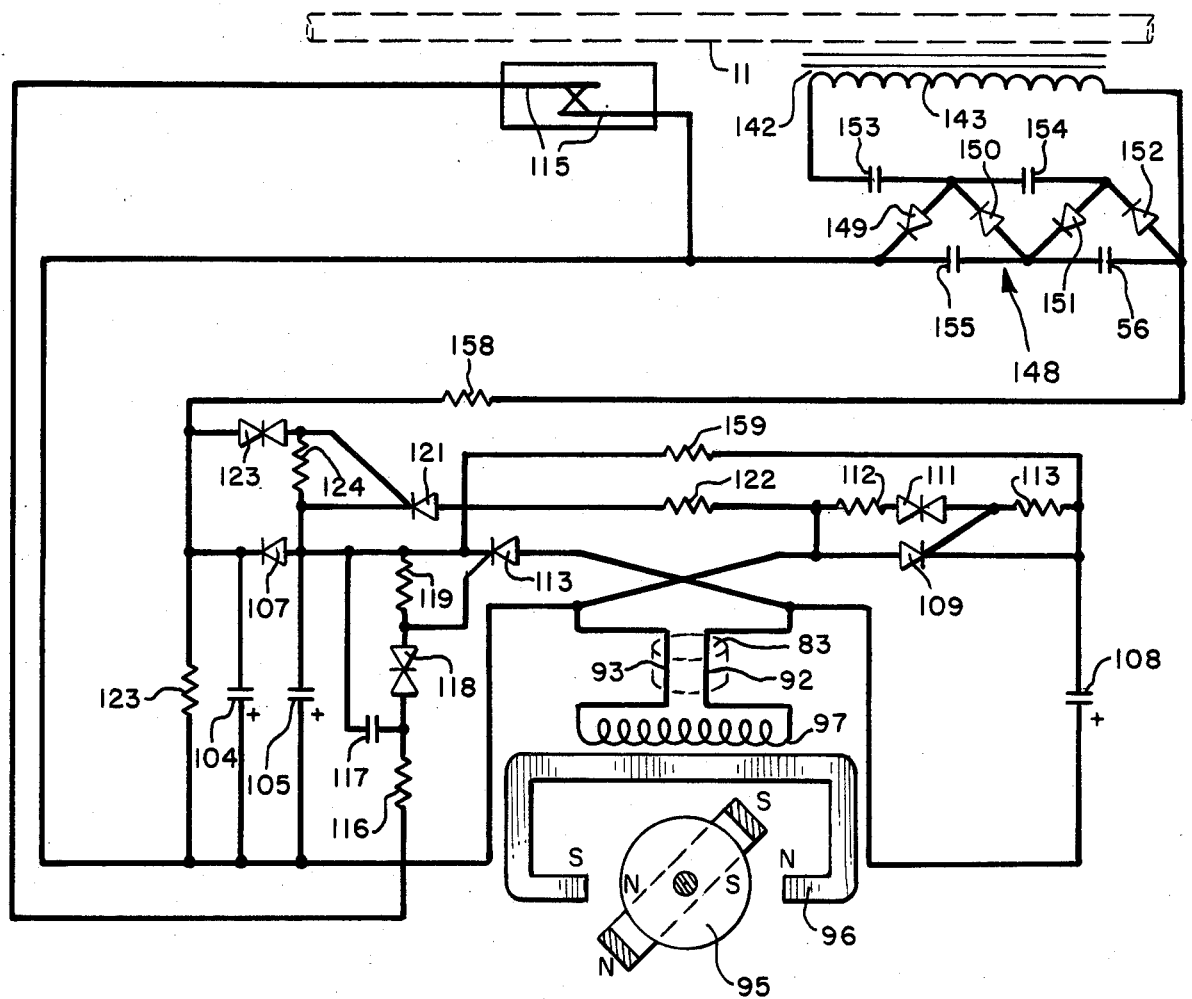
FIG. 15 is an electrical schematic diagram of the fault indicator illustrated in FIG. 14.

Another embodiment of the invention is shown in FIGS. 14 and 15. Following a power failure, it is not unusual for some voltage to remain present on the conductor. This is particularly true when the fault occurs in one phase of a multiphase system. If this voltage is sufficiently great, it may cause the first and second capacitors to recharge thereby rendering the fault indicator sensitive to fault currents and susceptible to false triggering by the inrush current.

To avoid this possibility, the fault indicator shown in FIGS. 14 and 15 includes a current transformer module 141 for sensing the current through a conductor 140.

The current transformer module 141 includes a magnetic pole core 142 fashioned form a magnetically conductive material such as iron and is adapted to encircle the conductor. A pick-up winding 143 is positioned around the magnetic core. The current transformer module is connected with a status indicating module 144 by means of a two conductor cable 146. A handling loop 147 on the magnetic core allows the lineman to position the current transformer module 141 on the conductor.

Referring to FIG. 15, the fault indicator is seen to include a voltage multiplier 148 comprising diodes 149–152 and capacitors 153–156. Voltage induced in coil 143 by reason of current passing through conductor 140 is applied through resistor 158 to the positive polarity terminal of first capacitor 104. An additional resistor 159 is connected between the positive polarity terminals of second and third capacitors 105 and 108 respectively, and allows the signal from the voltage multiplier to charge the third capacitor. In all other respects, operation of this circuit is substantially the same as previously described. Since the circuit relies on current through the conductor to charge the capacitor, residual voltage present following a power failure will not be sufficient to enable the fault indicator prior to the restoration of energy to the distribution system.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A fault indicator for indicating the occurrence of a fault current of a predetemined threshold level in an electrical conductor of an alternating current power distribution system, wherein the conductor is subject to an inrush current of a predetermined level equal to or greater than the fault current threshold level upon interruption and subsequent restoration of voltage on the conductor, comprising:
   status indicating means having a reset-indicating stage and a fault-indicating state;
   trip circuit means operatively associated with said status indicating means for conditioning said status indicating means to said fault-indicating state in response to the occurrence of a fault cuurent in the electrical conductor;
   said trip circuit means including a trip capacitor, means for developing a charge in said trip capacitor during the presence of voltage on the conductor, and means for utilizing the charge developed in said trip capacitor to condition said status indicating means to said fault-indicating state; and
   trip inhibit circuit means operatively associated with said trip circuit means for inhibiting said trip circuit means from responding to currents at said predetermined inrush current level for a predetermined period of time following interrruption and restoration of voltage on the electrical conductor, whereby said fault indicator is rendered non-responsive to the occurrence of such inrush currents in the conductor.

2. A fault indicator as defined in claim 1 wherein said trip inhibit circuit means include circuit means for at least partially discharging said trip capacitor upon loss of voltage on the conductor.

3. A fault indicator as defined in claim 2 wherein said trip inhibit circuit means comprise a discharge circuit including a switch device connected across said trip capacitor, and voltage loss sensing means for conditioning said switch device conductive upon loss of voltage on the conductor.

4. A fault indicator as defined in claim 1 wherein said status indicating means include a magnetic winding, and said trip capacitor is discharged through said magnetic winding by said trip circuit means to condition said status indicating means to said fault indicating state.

5. A fault indicator for indicating the occurrence of a fault current of a predetermined therehold level in an electrical conductor of an alternating current power distribution system, wherein the conductor is subject to an inrush current of a predetermined level equal to or greater than the fault current threshold level upon interruption and subsequent restoration of voltage on the conductor, comprising:
   a source of unidirectional current;
   a trip capacitor connected with said source of unidirectional current, whereby said trip capacitor is charged by said current source;
   a trip inhibit capacitor connected with said source of unidirectional current, whereby said trip inhibit capacitor is charged by said current source;
   status indicating means having a reset indicating state and a fault indicating state and incuding a magnetic actuator winding;
   trip circuit means connected between said trip capacitor and said magnetic actuator winding and responsive to the occurrence of a fault current in the conductor for discharging said trip capacitor through at least a portion of said winding to condition said status indicating means to said fault indicating state;
   discharge circuit means connected across said trip inhibit capacitor for discharging said trip inhibit capacitior upon loss of voltage on said conductor; and
   trip inhibit circuit means responsive to the voltage difference between said trip capacitor and said trip inhibit capacitor for at least partially discharging said trip capacitor upon loss of voltage on the conductor, whereby said fault indicator is rendered non-operative to the occurrence of such inrush current in the conductor during a predetermined period following energization of the conductor.

6. A fault indicator as defined in claim 5 wherein said trip inhibit capacitor is connected directly across said current source, said trip capacitor is connected across said current source through an isolation diode forward-biased to said current source, and said discharge current means comprise a resistor connected across said trip inhibit capacitor.

7. A fault indicator as defined in claim 6 wherein said trip inhibit circuit means comprise an electrical switch device connected across said trip capacitor and having a conduction state dependent on the voltage differential between said capacitors.

* * * * *